(12) United States Patent
Mori

(10) Patent No.: US 11,791,220 B2
(45) Date of Patent: Oct. 17, 2023

(54) SEMICONDUCTOR DEVICE AND SEMICONDUCTOR DEVICE FABRICATION METHOD

(71) Applicant: LAPIS SEMICONDUCTOR CO., LTD., Kanagawa (JP)

(72) Inventor: Toru Mori, Miyagi (JP)

(73) Assignee: LAPIS SEMICONDUCTOR CO., LTD., Yokohama (JP)

(*) Notice: Subject to any disclaimer, the term of this patent is extended or adjusted under 35 U.S.C. 154(b) by 196 days.

(21) Appl. No.: 17/487,375

(22) Filed: Sep. 28, 2021

(65) Prior Publication Data
US 2022/0102222 A1 Mar. 31, 2022

(30) Foreign Application Priority Data
Sep. 29, 2020 (JP) .................. 2020-163985

(51) Int. Cl.
*H01L 21/8238* (2006.01)
*H01L 29/66* (2006.01)

(52) U.S. Cl.
CPC ........... *H01L 21/823892* (2013.01); *H01L 21/823814* (2013.01); *H01L 21/823857* (2013.01); *H01L 29/66659* (2013.01)

(58) Field of Classification Search
CPC ..... H01L 21/823892; H01L 21/823814; H01L 21/823857; H01L 29/66659; H01L 27/092; H01L 27/0617; H01L 29/0653; H01L 29/1045; H01L 23/5256; H01L 29/7836
See application file for complete search history.

(56) References Cited

U.S. PATENT DOCUMENTS 8,598,634 B1 * 12/2013 Zhu .................. H01L 23/5256
977/734

* cited by examiner

*Primary Examiner* — David Vu
(74) *Attorney, Agent, or Firm* — Volentine, Whitt & Francos, PLLC

(57) ABSTRACT

A semiconductor device, including: a first well of a first polarity formed in a semiconductor substrate; a source region and a drain region of a second polarity formed in the first well so as to be separated from each other by a predetermined spacing; an impurity region of the first polarity formed so as to surround the source region and the drain region; a first gate oxide film formed on the semiconductor substrate at a position between the source region and the drain region; a second gate oxide film formed on the first gate oxide film; a gate electrode formed on the second gate oxide film; and an impurity layer of the first polarity formed below the first gate oxide film.

7 Claims, 17 Drawing Sheets

SEMICONDUCTOR DEVICE AND SEMICONDUCTOR DEVICE FABRICATION METHOD

CROSS-REFERENCE TO RELATED APPLICATION

This application is based on and claims priority under 35 USC 119 from Japanese Patent Application No. 2020-163985 filed on Sep. 29, 2020, the disclosure of which is incorporated by reference herein.

BACKGROUND

Technical Field

The present disclosure relates to a semiconductor device and a semiconductor device fabrication method.

Related Art

Technology relating to fuse elements is one area of technology employed in semiconductor devices. A fuse element in a semiconductor device is an element that is provided inside the semiconductor device and is able to be cut using a predetermined method, and so is an element that enables adjustment (trimming) of circuits to be performed by such cutting. The present disclosure relates to a fuse element in a semiconductor device, and in particular to a high withstand voltage fuse element therein.

FIG. 8A to FIG. 8C illustrate examples of standard fuses. FIG. 8A and FIG. 8B illustrate a laser fuse. FIG. 8A illustrates a plan view of the laser fuse, and FIG. 8B illustrates a cross-section of the laser fuse. The laser fuse illustrated in FIG. 8A and FIG. 8B includes aluminum (Al) wiring 100 with both ends connected to circuit elements or the like. Targeted trimming is performed by cutting the Al wiring 100 using a laser in a cutting area CA.

FIG. 8C illustrates a different example of a ZAP fuse. As illustrated in FIG. 8C, the ZAP fuse includes an n+ impurity region 101, a p+ impurity region 102, and an overlapping region 103. The n+ impurity region 101 is a region doped with an n-type impurity at a relatively high concentration, the p+ impurity region 102 is a region doped with a p-type impurity at a relatively high concentration, and the overlapping region 103 is a region where the n+ impurity region 101 and the p+ impurity region 102 overlap. In the ZAP fuse, trimming is performed by applying voltage in a forward direction across the n+ impurity region 101 and the p+ impurity region 102 so as to break the junction by causing an overload current to flow.

Note that trimming using a fuse is not only performed as part of the fabrication processes, and is also sometimes performed in a mounted state (an assembled state) such as in a package or the like after the fabrication processes have been completed. Thus it would be extremely convenient if trimming could be performed in both states. From this perspective, the laser fuse described above is not able to perform trimming post assembly since this would entail cutting the Al wiring 100 with a laser after the fabrication processes have been completed. On the other hand, the ZAP fuse is able to perform trimming post assembly through performing cutting by passing an overload current through the overlapping region 103 using terminals on the package. However due to employing a junction of high concentrations from the n+ impurity region 101 and the p+ impurity region 102, this has the disadvantage that trimming cannot be performed at locations applied with a high voltage.

Moreover, due to the fuse element being an additional element, in a semiconductor device fabrication method specialized processes are preferably reduced as much as possible and also commonality is preferably achieved in fabrication processes for the main circuit elements of the semiconductor device, thereby simplifying the fabrication processes and reducing costs.

SUMMARY

In consideration of the above circumstances, the present disclosure provides a semiconductor device including a simple-to-fabricate fuse element that has a high withstand voltage and enables trimming to be performed post assembly, and to provide a fabrication method of such a semiconductor device.

A semiconductor device according to the present disclosure includes: a first well of a first polarity formed in a semiconductor substrate; a source region and a drain region of a second polarity formed in the first well so as to be separated from each other by a predetermined spacing; an impurity region of the first polarity formed so as to surround the source region and the drain region; a first gate oxide film formed on the semiconductor substrate at a position between the source region and the drain region; a second gate oxide film formed on the first gate oxide film; a gate electrode formed on the second gate oxide film; and an impurity layer of the first polarity formed below the first gate oxide film.

A semiconductor device fabrication method according to the present disclosure is a method of fabricating a semiconductor device including a first element configured to function as a fuse and a second element configured to function as a transistor formed on the same semiconductor substrate. The method includes: forming a well of a first polarity in the semiconductor substrate; forming a source region and a drain region of a second polarity in the well so as to be separated from each other by a predetermined spacing; forming a first gate oxide film on the semiconductor substrate at a position between the source region and the drain region; forming the second element by forming a second gate oxide film on the first gate oxide film; and further forming the first element by forming an impurity layer of the first polarity below the first gate oxide film.

The present disclosure exhibits the advantageous effect of enabling provision of a semiconductor device including a high withstand voltage fuse element easily fabricated by being trimmable after assembly, and provision of a fabrication method of such a semiconductor device.

BRIEF DESCRIPTION OF THE DRAWINGS

Exemplary embodiments of the present invention will be described in detail based on the following figures, wherein.

DETAILED DESCRIPTION

Detailed explanation follows regarding exemplary embodiments of the present disclosure, with reference to the drawings. The following explanation describes an example of a configuration in which a semiconductor device according to the present disclosure, equipped with a configuration common to that of a high voltage metal oxide semiconductor (MOS) transistor (hereafter referred to as a high voltage (HV) transistor), is applied to a fuse that is capable of being fabricated in fabrication processes substantially common to fabrication processes of an HV transistor.

First Exemplary Embodiment

Figure 1A:
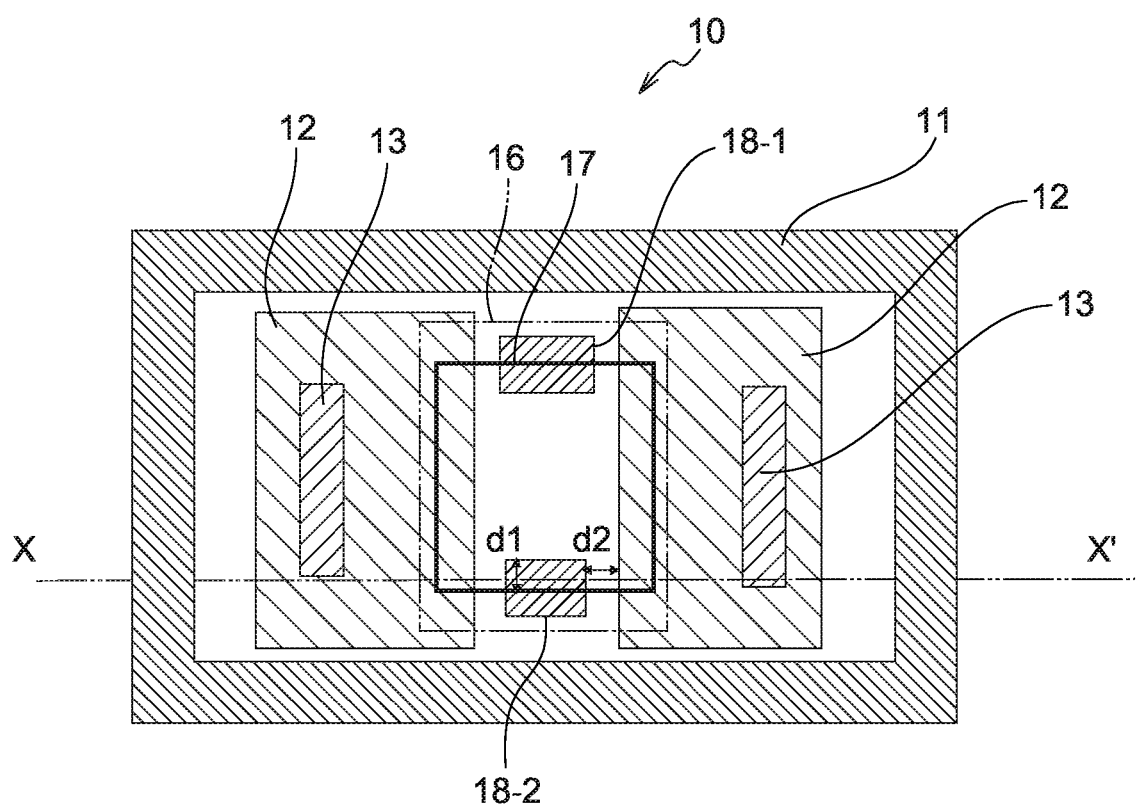
FIG. 1A is a plan view illustrating an example of a configuration of a semiconductor device according to a first exemplary embodiment.

Explanation follows regarding a semiconductor device 10 according to a first exemplary embodiment, with reference to FIG. 1A to FIG. 5C. FIG. 1A is a plan view of the semiconductor device 10, and FIG. 1B is a cross-section sectioned along line X-X' in FIG. 1A. As illustrated in FIG. 1B, the semiconductor device 10 includes a P well (a well region doped with a p-type impurity) 20 formed in a non-illustrated semiconductor substrate, a p+ impurity region 11, n− impurity regions 12, n+ impurity regions 13, a first gate oxide film 14, a second gate oxide film 15, a gate electrode 16, an electron pull-up layer 18-2, and trenches 19. Configuration other than the electron pull-up layer 18-2 is common to an HV transistor (see FIG. 2). In other words, the semiconductor device 10 has a configuration of an HV transistor to which the electron pull-up layer 18-2 has been added. Thus, in the present exemplary embodiment, the fuse and the HV transistor can be differentially produced by simple alterations to the fabrication process.

The n− impurity regions 12 are n-wells formed in the p-well 20. The n+ impurity regions 13 are formed in the n− impurity regions 12 so as to be interposed between the respective trenches 19. The n+ impurity regions 13 function as a source region and a drain region. In the semiconductor device 10, a gate oxide film has a double layer structure including the first gate oxide film 14 and the second gate oxide film 15. As an example, the first gate oxide film 14 is a thermal oxide film having a thickness of from 10 nm to 50 nm, and the second gate oxide film 15 is a film of LP-TEOS (hereafter referred to as "TEOS film") having a thickness of from 150 nm to 250 nm. Note that LP-TEOS refers to an oxide film formed with TEOS using low pressure chemical vapor deposition (CVD). The electron pull-up layer 18-2 is a layer unique to the semiconductor device 10 serving as a fuse, and is a region doped with p-type impurity at a relatively high concentration. The impurity concentration of the electron pull-up layer 18-2 is, for example, higher than both the impurity concentration of the p-well 20 and the impurity concentration of the p+ impurity region 11. Although the trenches 19 are employed for shallow trench isolation (STI) in the semiconductor device 10 according to the present exemplary embodiment, there is no limitation thereto.

As illustrated in FIG. 1A, the p+ impurity region 11 is formed so as to surround an outer periphery of the semiconductor device 10. An active region 17 is formed at a position below the gate electrode 16. The electron pull-up layers 18-1, 18-2 are each arranged so as to partially overlap the active region 17. Note that the trenches 19 are omitted from illustration in FIG. 1A.

Figure 2:
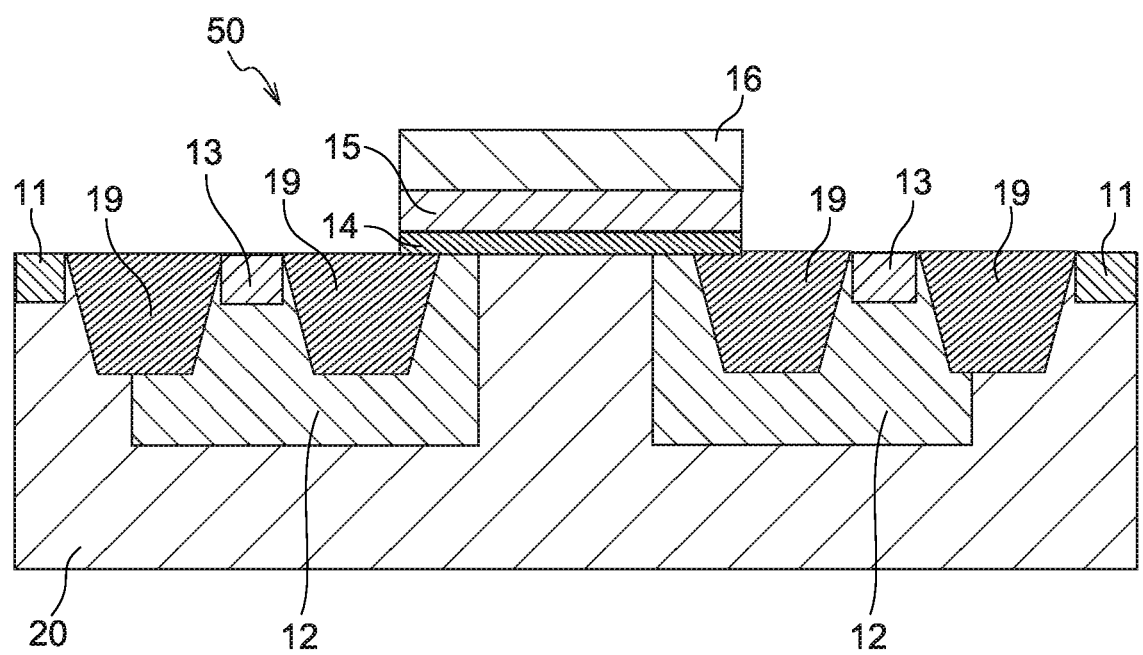
FIG. 2 is a cross-section illustrating an example of a configuration of a high voltage MOS transistor according to the first exemplary embodiment.

FIG. 2 illustrates a semiconductor device 50 serving as an HV transistor according to the present exemplary embodiment. As described above, the semiconductor device 50 has the same configuration as the semiconductor device 10 except for lacking the electron pull-up layers 18-1, 18-2 (hereafter collectively referred to as the "electron pull-up layers 18") omitted therefrom. Note that the "electron pull-up layers 18" are examples of an "impurity layer" according to the present disclosure.

Figure 3A:
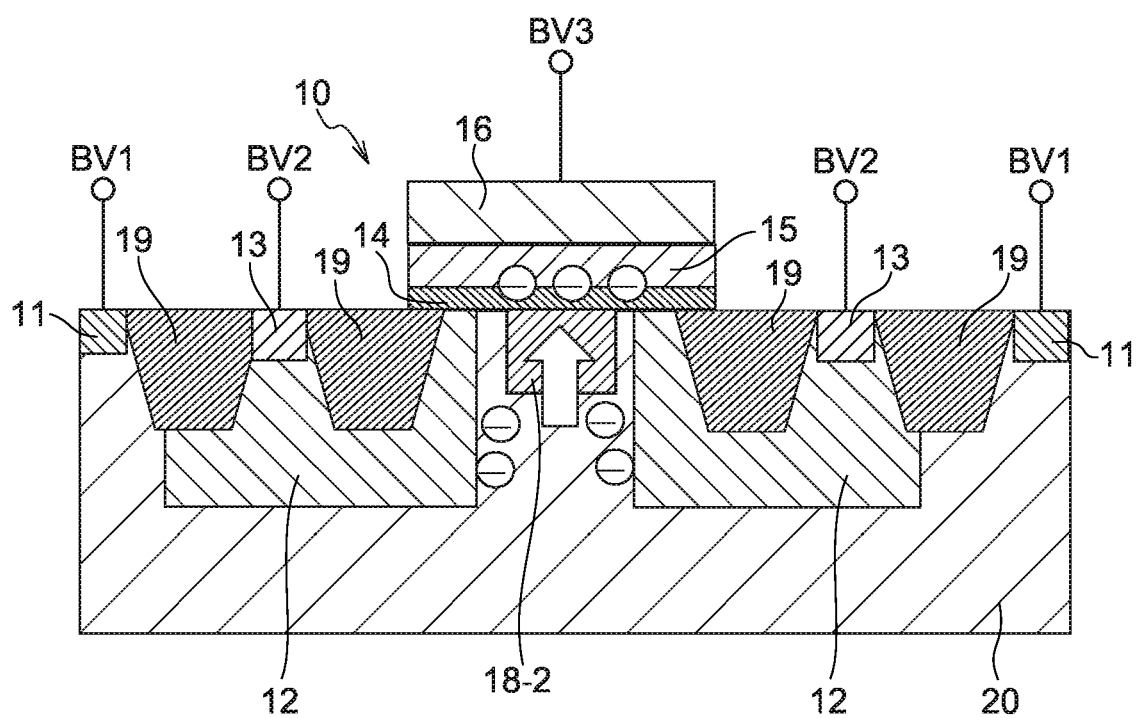
FIG. 3A is a cross-section to explain a writing operation in a semiconductor device according to the first exemplary embodiment.

Next, explanation follows regarding operation of the electron pull-up layers 18-1, 18-2 according to the present exemplary embodiment, with reference to FIG. 3A to FIG. 4B. In the semiconductor device 10, bias voltages such as illustrated in FIG. 3A are applied when performing trimming (cutting, hereafter sometimes referred to as "writing"). Namely, a bias voltage BV1 is applied to the p+ impurity region 11, a bias voltage BV2 is applied to the n+ impurity regions 13, and a bias voltage BV3 is applied to the gate electrode 16. A combination (BV1, BV2, BV3) of the bias voltages BV1, BV2, BV3 (hereafter collectively referred to as the "bias voltages BV") may for example be set as follows. Namely, the combination may be set as:

(BV1, BV2, BV3)=(−70V to −100V, 0V, 0V); or (BV1, BV2, BV3)=(0V, 70V to 80V, 70V to 80V).

However, the combination of bias voltages BV is not limited thereto, as long as the combination is set such that a predetermined potential difference is applied between the p+ impurity region 11, and the n+ impurity regions 13 and the gate electrode 16.

When the bias voltages BV are applied to the semiconductor device 10 in the above-described manner, electrons are generated in the p-well 20. The electrons are pulled-up by high electric fields arising from the electron pull-up layers 18 (only the electron pull-up layer 18-2 is visible in FIG. 3A), and are accumulated at the gate oxide films (the first gate oxide film 14 and the second gate oxide film 15), and in particular at the interface between the first gate oxide film 14 and the second gate oxide film 15. Namely, in the semiconductor device 10, electrons are mainly accumulate at the interface between the first gate oxide film 14 and the second gate oxide film 15 by performing writing processing. These electrons are moreover held thereat even when the bias voltages BV are stopped.

Figure 3B:
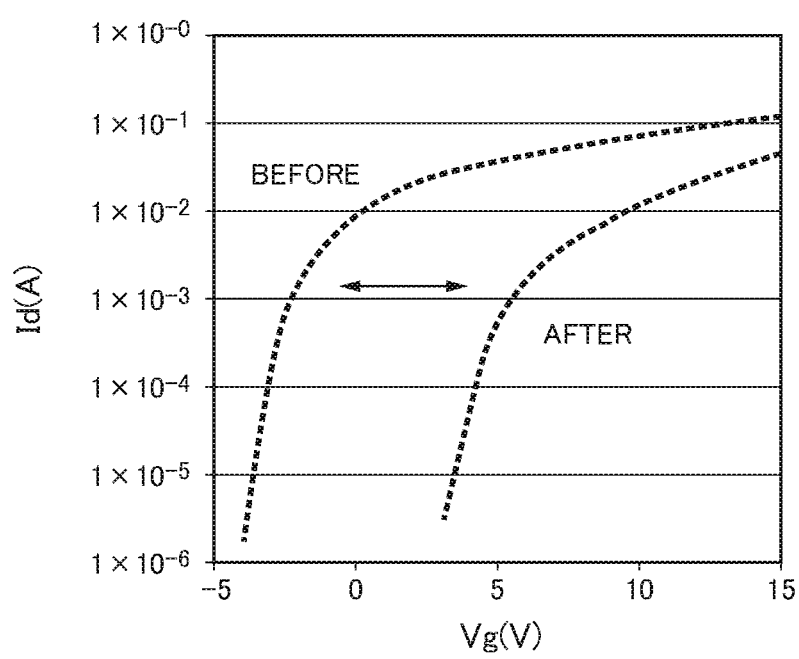
FIG. 3B is a graph illustrating drain current characteristics before and after writing in the semiconductor device according to the first exemplary embodiment.

FIG. 3B illustrates characteristics of gate voltage (Vg) and drain current (Id) before and after writing. As illustrated in FIG. 3B, the characteristics of the semiconductor device 10 serving as an HV transistor are ON at Vg=0V prior to writing and OFF at Vg=0V after writing. Using Vg=0V as a boundary (hereafter sometimes referred to as the "boundary voltage"), the semiconductor device 10 characteristics, namely that the HV transistor passes current (is shorted) before performing writing and is blocked (open) by performing writing, are utilized to perform trimming using the writing processing. Obviously these examples of bias voltages BV and boundary voltage are merely examples thereof, and appropriate values may be set according to the characteristics and so on of the HV transistor.

Figure 4A:
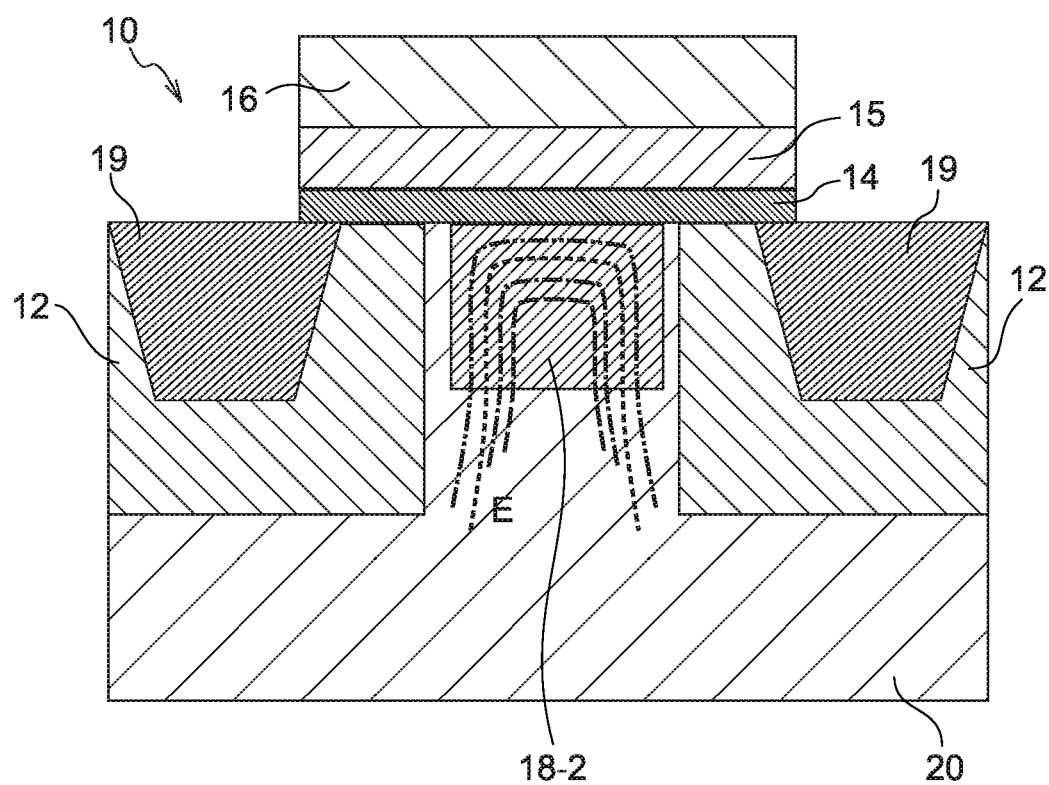
FIG. 4A is a cross-section illustrating an electric field distribution during writing in the semiconductor device according to the first exemplary embodiment.
Figure 4B:
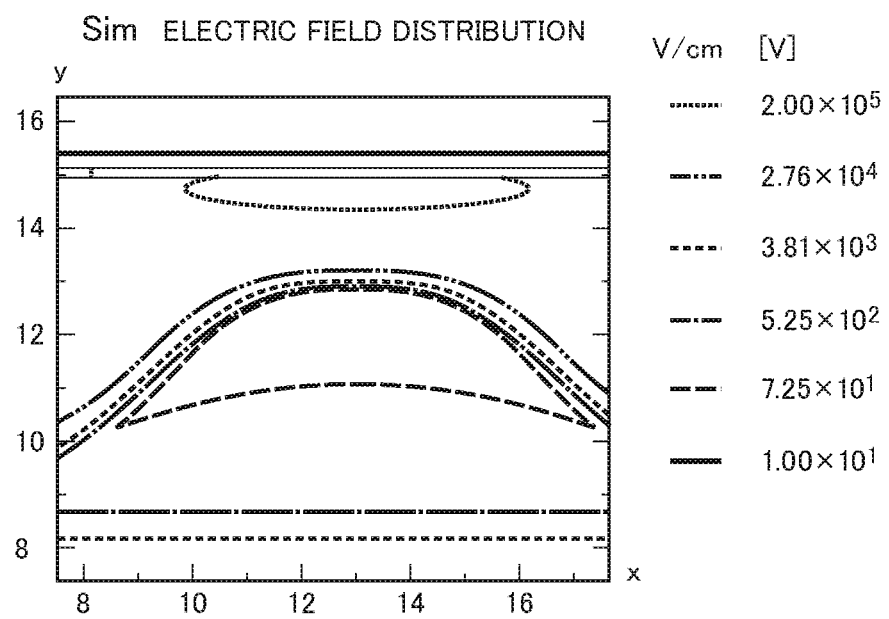
FIG. 4B is a simulation result illustrating an electric field distribution during writing in the semiconductor device according to the first exemplary embodiment.

More detailed explanation follows regarding action of the electron pull-up layers 18, with reference to FIG. 4A and FIG. 4B. In the semiconductor device 10, an electric field is generated by the above bias processing so as to encroach toward the gate oxide films (the first gate oxide film 14 and the second gate oxide film 15). The electron pull-up layers 18 act so as to further strengthen the electric field in this region. FIG. 4B illustrates a result of a simulation of an electric field distribution in the semiconductor device 10, illustrated by equipotential lines between the two n– impurity regions 12. As illustrated in FIG. 4B, the equipotential lines between the two n– impurity regions 12 exhibit bulging shapes in which the electric potential is higher the further toward the top of the page. FIG. 4A is a schematic diagram of the simulation result illustrated in FIG. 4B, in which an electric field E is generated between the two n– impurity regions 12 so as to encroach toward the gate oxide films (the first gate oxide film 14 and the second gate oxide film 15), with the electric potential being higher the closer to the gate oxide films (the first gate oxide film 14 and the second gate oxide film 15). Namely, the electric field E is generated in a direction from the top toward the bottom of the page, this electric field E is further strengthened by the electron pull-up layers 18, and electrons are pulled-up toward the gate oxide films (the first gate oxide film 14 and the second gate oxide film 15) by this strengthened electric field E.

Explanation follows regarding the positions of the electron pull-up layers 18, with reference to FIG. 1A. In order for the electron pull-up layers 18 to exhibit the above-described action, the relative positional relationships need to be appropriately set between the electron pull-up layers 18, and the active region 17 and the n– impurity regions 12. Similar applies to the electron pull-up layer 18-1 as for the electron pull-up layer 18-2, and so explanation follows regarding the electron pull-up layer 18-2 as an example. First, an overlap length d1 between the electron pull-up layer 18-2 and the active region 17 is preferably set from 0.2 μm to 1 μm. This is because if the overlapping area of the electron pull-up layer 18-2 and the active region 17 is too large in proportion then this would affect the withstand voltage, whereas if the overlapping area of the electron pull-up layer 18-2 and the active region 17 is too small in proportion then this would affect the electrical characteristics after trimming. A distance d2 between the electron pull-up layer 18-2 and each of the n– impurity regions 12 is preferably set from 2 μm to 4 μm. Moreover, the writing (trimming) characteristics tend to deteriorate as the first gate oxide film 14 becomes thicker.

As described above, the semiconductor device 10 according to the present exemplary embodiment has basically the same structure as a high voltage MOS transistor, and so a high voltage can be applied to the drain. Namely, the semiconductor device 10 enables a fuse function to be incorporated into a high voltage semiconductor device. Writing is performed using the double layer gate oxide film (the first gate oxide film 14 and the second gate oxide film 15) and the electron pull-up layers 18 arranged so as to partially overlap ends of the active region 17, thereby enabling trimming to be performed electrically. This enables trimming to be performed after assembly. Moreover, fabrication can be performed simply by adding the electron pull-up layers 18 to a high voltage MOS transistor, thereby enabling simplification of the fabrication of a semiconductor device including a fuse.

Figure 5A:
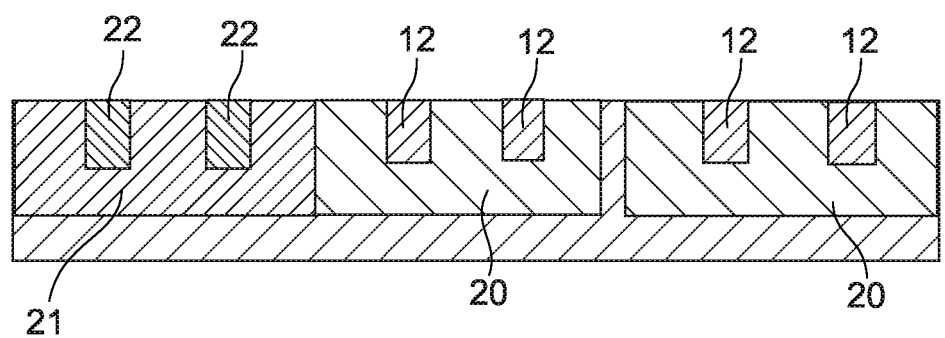
FIG. 5A is a cross-section illustrating an example of a semiconductor device fabrication method according to the first exemplary embodiment.
Figure 5B:
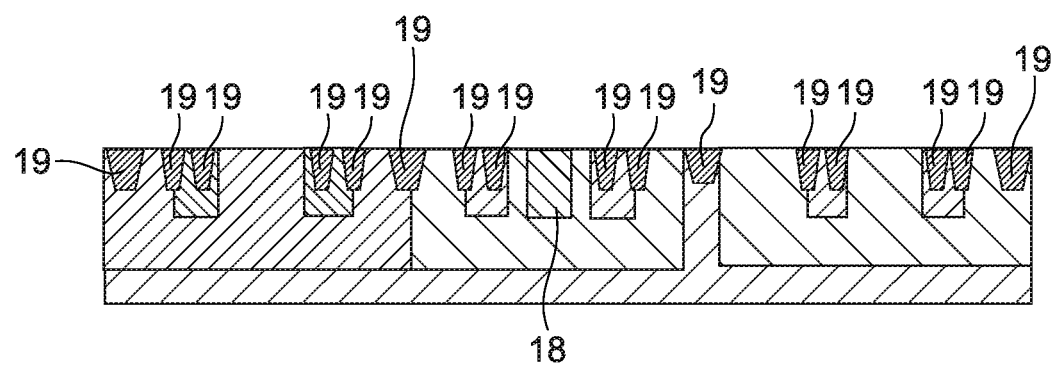
FIG. 5B is a cross-section illustrating an example of a semiconductor device fabrication method according to the first exemplary embodiment.
Figure 5C:
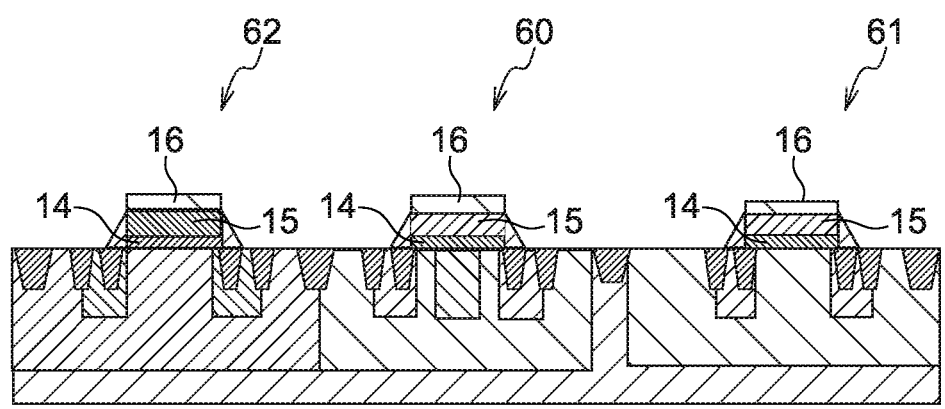
FIG. 5C is a cross-section illustrating an example of a semiconductor device fabrication method according to the first exemplary embodiment.

Next, explanation follows regarding a fabrication method of the semiconductor device 10, with reference to FIG. 5A to FIG. 5C. As described above, the semiconductor device 10 according to the present exemplary embodiment is able to implement various circuit functionality by being formed as a hybrid semiconductor device on the same substrate as an HV transistor (the semiconductor device 50). Explanation follows regarding an example of a fabrication method of a hybrid semiconductor device formed with both such an HV transistor and a high withstand voltage fuse. Explanation follows regarding an example of fabrication of a fuse 60 (the semiconductor device 10), an n-type MOS transistor 61 (HV transistor, the semiconductor device 50), and a p-type MOS transistor 62 (HV transistor), with reference to FIG. 5A to FIG. 5C.

As illustrated in FIG. 5A, the p-well 20 is formed by introducing a p-type impurity into a semiconductor substrate (not illustrated in the drawings) using photolithography, ion implantation, and the like, and an n-well 21 is formed by introducing an n-type impurity thereby. The n-impurity regions 12 and p-impurity regions 22 are then formed by photolithography. The impurities are caused to disperse by performing heat treatment thereafter, and an oxide film formed by the heat treatment is removed.

Then, as illustrated in FIG. 5B, the trenches 19 are formed by photolithography and etching. The trenches 19 are then filled with an insulating material using, for example, high density plasma chemical vapor deposition (HDP-CVD), and the insulating material is then ground down and flattened using chemical mechanical polishing (CMP). The electron pull-up layers 18 are then formed by introducing a p-type impurity at a high concentration.

Then, as illustrated in FIG. 5C, the first gate oxide film 14 and the second gate oxide film 15 are formed using photolithography and etching. A polysilicon film is then grown using CVD or the like, and the gate electrode 16 is formed by photolithography and etching. n+ impurity regions (in the case of the n-type MOS transistor 61; not illustrated in the drawings) or p+ impurity regions (in the case of the p-type MOS transistor 62; not illustrated in the drawings) that will be the source and drain are then formed using photolithography, ion implantation, and the like.

Second Exemplary Embodiment

Figure 6:
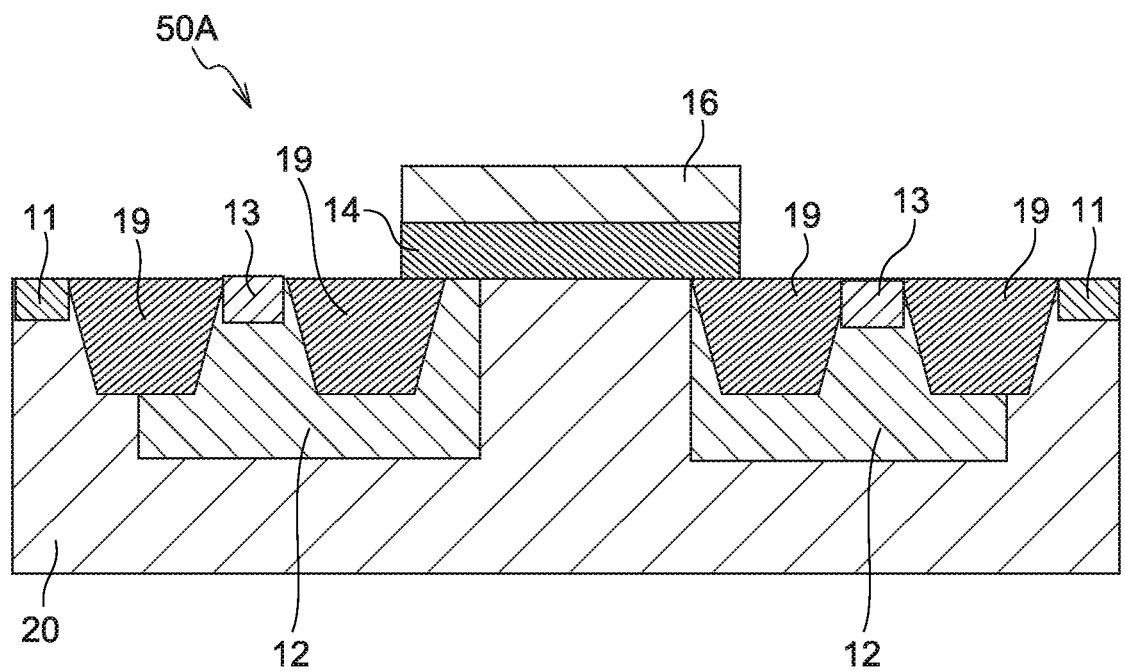
FIG. 6 is a cross-section illustrating an example of a configuration of a high voltage MOS transistor according to a second exemplary embodiment.

Explanation follows regarding a semiconductor device according to a second exemplary embodiment, with reference to FIG. 6. In the present exemplary embodiment, the semiconductor device is a hybrid device formed with both a fuse and an HV transistor in an embodiment in which a semiconductor device 50A serving as the HV transistor has been substituted for the semiconductor device 50 serving as the HV transistor. Thus, the combinable fuse is the same as in the semiconductor device 10, and so explanation thereof is omitted.

As illustrated in FIG. 6, the semiconductor device 50A has the second gate oxide film 15 of the semiconductor device 50 illustrated in FIG. 2 removed, and the gate oxide film is configured by a single layer of the first gate oxide film 14. In the semiconductor device 10, the second gate oxide film 15 that is a TEOS film was provided to accumulate electrons. Although including the second gate oxide film 15 would also be desirable in the semiconductor device 50A from the perspective of increasing the commonality of the fabrication processes, the accumulation of electrons is unnecessary in the HV transistor. On the contrary, there is sometimes a drop in reliability as the HV transistor due to electrons being accumulated. Thus, the second gate oxide film 15, which is configuration to accumulate electrons, is removed in the present exemplary embodiment.

In fabrication processes of a semiconductor device including the semiconductor device 50A, after completing the forming of the semiconductor device 10, the gate oxide films (the first gate oxide film 14 and the second gate oxide film 15) formed on the semiconductor device 50A are first removed, and then a new first gate oxide film 14 is formed. Although this increases the number of processes in the fabrication processes, the reliability of the semiconductor device 50A can be further improved when serving as the HV transistor.

Third Exemplary Embodiment

Figure 7A:
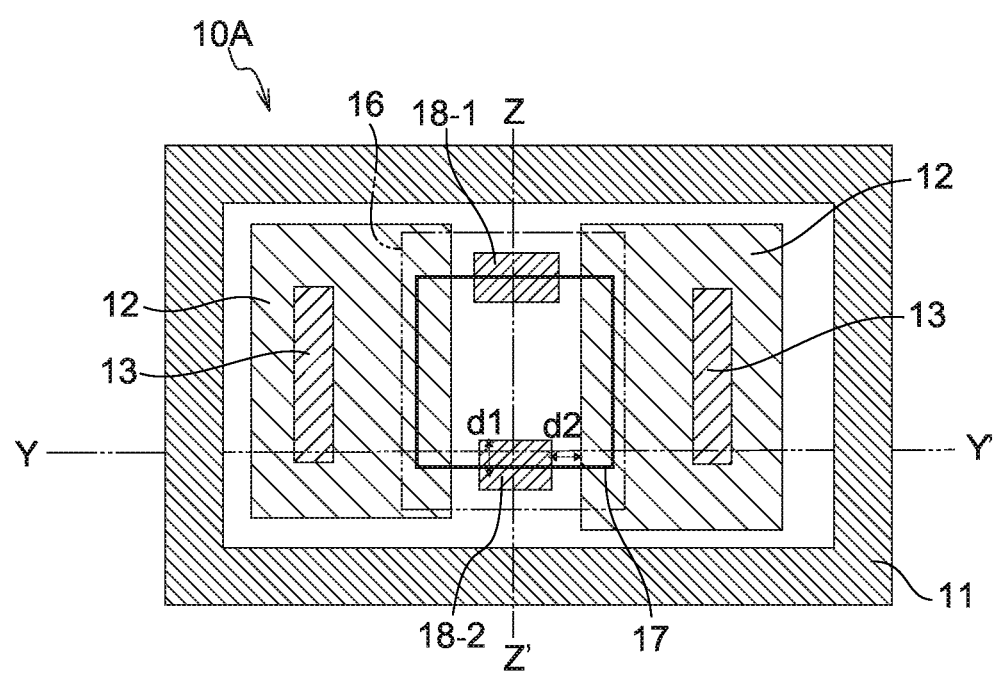
FIG. 7A is a plan view illustrating an example an example of a configuration of a semiconductor device according to a third exemplary embodiment.
Figure 7B:
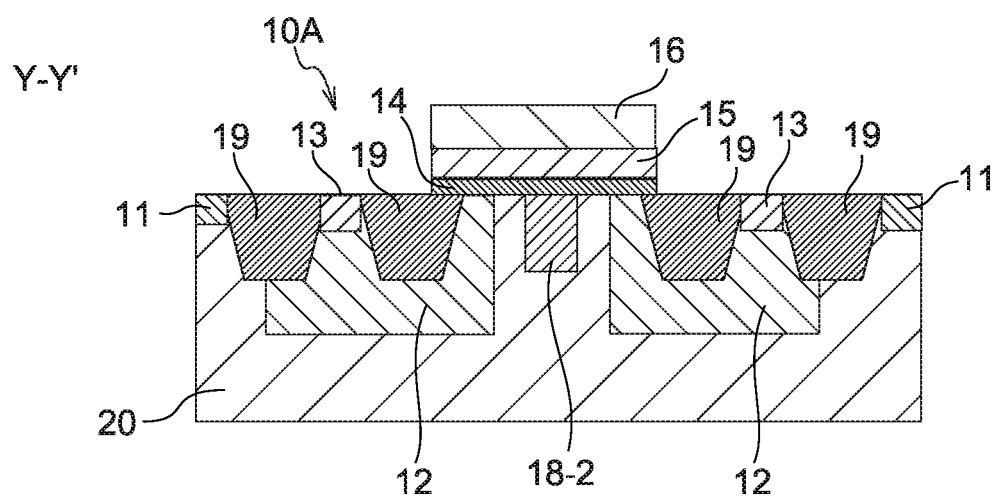
FIG. 7B is a cross-section along line Y-Y' illustrating an example of a configuration of a semiconductor device according to the third exemplary embodiment.
Figure 7C:
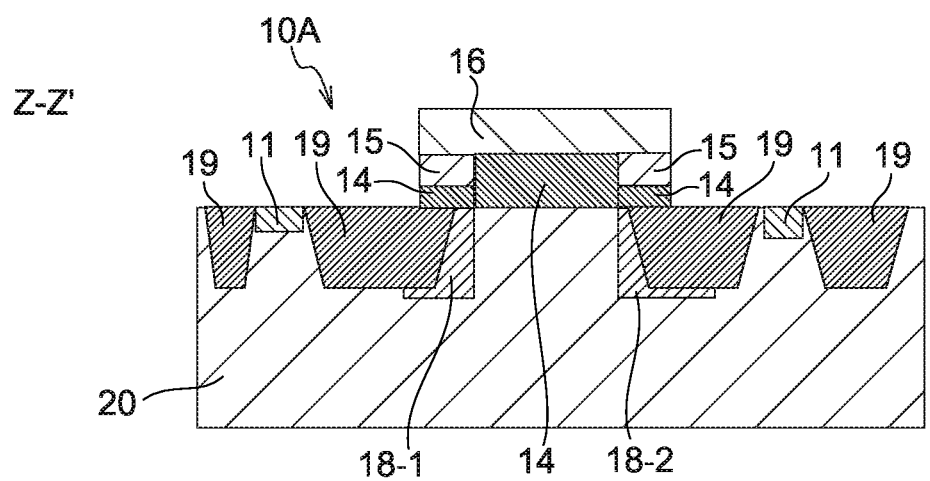
FIG. 7C is a cross-section along line Z-Z' illustrating an example of a configuration of a semiconductor device according to the third exemplary embodiment.
Figure 8A:
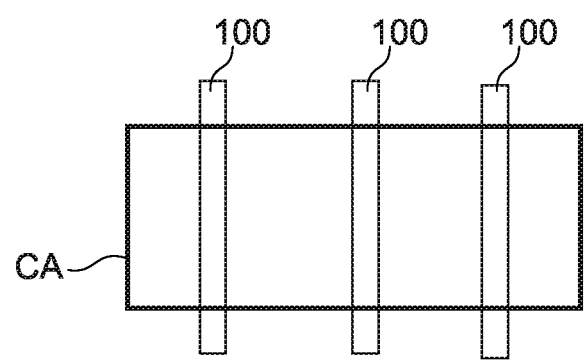
FIG. 8A is a plan view illustrating a laser fuse.
Figure 8B:
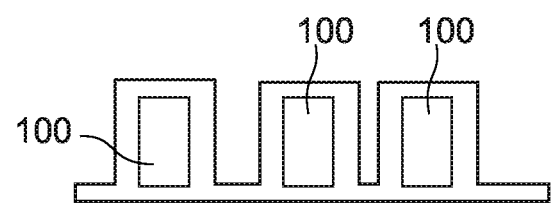
FIG. 8B is a cross-section illustrating the laser fuse.
Figure 8C:
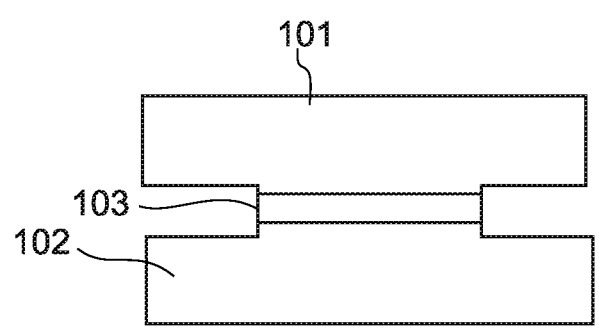
FIG. 8C is a plan view illustrating a ZAP fuse.

Explanation follows regarding a semiconductor device 10A according to a third exemplary embodiment, with reference to FIG. 7A to FIG. 7C. The placement position of the double layer gate oxide film (the first gate oxide film 14 and the second gate oxide film 15) is a more limited configuration in the semiconductor device 10A compared to the semiconductor device 10. FIG. 7A is a plan view of the semiconductor device 10A, FIG. 7B is a cross-section sectioned along line Y-Y' in FIG. 7A, and FIG. 7C is a cross-section sectioned along line Z-Z' in FIG. 7A.

Figure 1B:
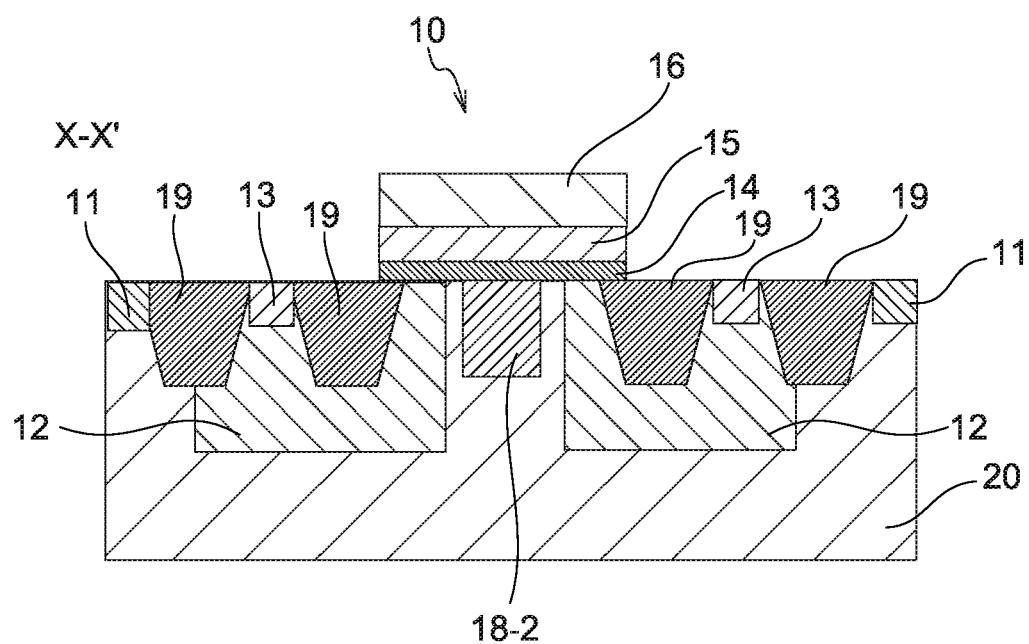
FIG. 1B is a cross-section illustrating an example of a configuration of a semiconductor device according to the first exemplary embodiment.

As illustrated in FIG. 7B, the cross-section of the semiconductor device 10A sectioned along line Y-Y' is no different from the cross-section of the semiconductor device 10 illustrated in FIG. 1B. However, as illustrated in FIG. 7C, the cross-section sectioned along line Z-Z' is different to an equivalent cross-section of the semiconductor device 10. Namely, as illustrated in FIG. 7C, in the semiconductor device 10A the gate oxide film includes a gate oxide film with a double layer structure of the first gate oxide film 14 and the second gate oxide film 15 arranged at both ends below the gate electrode 16, and a single layer gate oxide film of the first gate oxide film 14 arranged at the center thereof. The gate oxide film with the double layer structure is arranged above the electron pull-up layers 18-1, 18-2.

In the semiconductor device 10A according to the present exemplary embodiment, the double layered gate oxide film is only arranged directly above the electron pull-up layers 18. This enables writing to be more efficiently performed than with the semiconductor device 10, thereby enabling the trimming speed to be improved (increased). In terms of the fabrication processes, there is an additional fabrication process to re-form the gate oxide film, similarly to in the case of the semiconductor device 50A. However, since a region where the double layered gate oxide film is arranged in order to accumulate electrons is more limited than in the case of the semiconductor device 10, a drop in reliability is suppressed even though the HV transistor is fabricated with a similar configuration to the semiconductor device 10A serving as a fuse.

Note that although examples have been described in the above exemplary embodiments of configurations in which a semiconductor device serving as a fuse is formed using an n-type MOS transistor, a configuration may be adopted in which a p-type MOS transistor is employed. In such cases, holes accumulate in the double layered gate oxide film, and so the electron pull-up layer becomes a hole pull-up layer for pulling up holes. In this respect, the electron pull-up layer may be generally considered to be a carrier pull-up layer.

What is claimed is:

1. A semiconductor device, comprising:
   a first well of a first polarity formed in a semiconductor substrate;
   a source region and a drain region of a second polarity formed in the first well so as to be separated from each other by a predetermined spacing;
   an impurity region of the first polarity formed so as to surround the source region and the drain region;
   a first gate oxide film formed on the semiconductor substrate at a position between the source region and the drain region;
   a second gate oxide film formed on the first gate oxide film;
   a gate electrode formed on the second gate oxide film; and
   an impurity layer of the first polarity formed below the first gate oxide film.

2. The semiconductor device of claim 1, wherein an impurity concentration of the impurity layer is higher than both an impurity concentration of the first well and an impurity concentration of the impurity region.

3. The semiconductor device of claim 1, wherein a carrier is generated in the first well by applying a reverse bias between the impurity region and the source region, the drain region, and the gate electrode, so as to cause the generated carrier to accumulate at an interface between the first gate oxide film and the second gate oxide film.

4. The semiconductor device of claim 3, wherein the semiconductor device characteristics, which are changed by the carrier accumulated between the first gate oxide film and the second gate oxide film, are employed to achieve functionality as a fuse.

5. The semiconductor device of claim 1, further comprising:
   two second wells of the second polarity formed in the first well at a periphery of the source region and at a periphery of the drain region, respectively,
   wherein two of the impurity layers are disposed between the second wells so as to partially overlap an active region formed in the semiconductor substrate below the first gate oxide film.

6. The semiconductor device of claim 1, wherein, in a region below the gate electrode, the first gate oxide film and the second gate oxide film are formed only at portions above the impurity layer and only the first gate oxide film is formed at a remaining region.

7. A method of fabricating a semiconductor device including a first element configured to function as a fuse and a second element configured to function as a transistor formed on a same semiconductor substrate, the method comprising:
   forming a well of a first polarity in the semiconductor substrate;

forming a source region and a drain region of a second polarity in the well so as to be separated from each other by a predetermined spacing;

forming a first gate oxide film on the semiconductor substrate at a position between the source region and the drain region;

forming the second element by forming a second gate oxide film on the first gate oxide film; and further forming the first element by forming an impurity layer of the first polarity below the first gate oxide film.

* * * * *